United States Patent [19]
Algeri et al.

[11] 4,060,052
[45] Nov. 29, 1977

[54] COATING APPARATUS CONTROL INCLUDING TIME DEPENDENT INHIBITOR CIRCUIT

[75] Inventors: Harvey R. Algeri, North Olmsted; William C. Stumphauzer, Elyria, both of Ohio

[73] Assignee: Nordson Corporation, Amherst, Ohio

[21] Appl. No.: 691,820

[22] Filed: June 1, 1976

[51] Int. Cl.² .................... B05B 15/00; G05B 11/16; H03K 19/00

[52] U.S. Cl. ............................................. 118/2; 118/8; 118/11; 118/324; 364/468; 307/362; 328/72; 328/129

[58] Field of Search ............... 118/1, 2, 4, 5, 6, 7, 118/8, 11; 307/235 T; 330/141; 235/151.1; 134/44, 57 R; 198/502, 341, 468; 328/72, 129, 130; 325/410; 250/223

[56] References Cited

U.S. PATENT DOCUMENTS

| | | | |
|---|---|---|---|
| 2,961,990 | 11/1960 | Wruck | 118/2 |
| 3,365,586 | 1/1968 | Billings | 307/235 T |
| 3,521,598 | 7/1970 | Straw | 118/2 |
| 3,649,846 | 3/1972 | Frederiksen | 307/235 T |
| 3,682,131 | 8/1972 | Algeri et al. | 118/2 |
| 3,803,425 | 4/1974 | Carp | 307/235 T |
| 3,862,414 | 1/1975 | Algeri | 250/223 X |

OTHER PUBLICATIONS

Automatic Timing & Controls, Inc., Standard Instrument Corp., Div. "Jam Control with Proximity Sensor", [Mar. 1970], No. 704.

Primary Examiner—Morris Kaplan
Attorney, Agent, or Firm—George J. Coghill; Thomas L. Moorhead

[57] ABSTRACT

In a system for treating articles automatically while the articles are in a stopped treating position, an improved triggering circuit activates the treating device. In one embodiment, multiple cans are simultaneously spray coated by a corresponding number of spray coating guns. An indexing type conveyor with pockets for holding cans moves cans along the same path until a group of pockets holds cans in spraying positions proximate a group of coating guns. When the conveyor has moved a sufficient distance to bring the group of cans to the proper spraying positions, the conveyor is stopped for a predetermined period of dwell time sufficient to complete the spraying operation before the conveyor is again moved. A separate proximity sensor for each spraying position determines the presence or absence of a can in each spraying position independently. Any given spray gun is activated only if the sensor associated with that spraying position has sensed the presence of a can for some predetermined interval of time. When the dwell time has elapsed, the conveyor automatically moves a new group of cans to the spraying positions while the group of cans just sprayed are moved out of the spraying positions.

9 Claims, 2 Drawing Figures

COATING APPARATUS CONTROL INCLUDING TIME DEPENDENT INHIBITOR CIRCUIT

BACKGROUND OF THE INVENTION

This invention relates generally to automatically controlled article treatment systems utilizing an indexing type conveyor to transport articles automatically into and out of stationary positions where the articles are to be treated, and more particularly relates to an improvement in the control system used to activate the treating device. Such a treating device could be a dispenser or spray coating gun. While this invention has application to many diverse types of treating systems, in one embodiment the system is used for spray coating beverage cans. By way of example the system will be described in terms of its use for spray coating cans. The system has special application in article treatment apparatus which conveys multiple articles simultaneously and serially to multiple independent treating stations for simultaneous treatment, and where there exists the possibility that one or more of these multiple treating stations might not contain an article to be treated in any given treating cycle. The details of this and other advantages of the invention will be described shortly.

As stated above, the automatically controlled article treatment system includes an automatic indexing type conveying system. By an "indexing type" conveying system is meant a system which moves articles in equally spaced pockets, niches or the like, wherein the conveyor advances by some multiple of the spaces between pockets, then ceases to advance for a predetermined dwell time, then advances again by the same amount, and repeats the sequence continuously. The purpose of the sequence could be, for example to bring one or more of the pockets to a specific location so that the articles in these pockets can be treated by stationary treating devices such as automatic spray coating guns. The conveyor may be such that it simultaneously transports multiple articles to a corresponding number of treating stations. If two treating devices are used to simultaneously treat the articles in two adjacent pockets then the conveyor would be adjusted to advance by twice the distance between pockets on each move. The dwell time is predetermined by the time required for the treatment to be completed. Although it has been stated above that the conveyor ceases to move during the predetermined dwell time, it should be noted here that this statement is not meant to imply that the article is necessarily totally stationary. For example, in a system for spray coating cans the can may be spinning in a stopped pocket while the coating process is being carried out.

Generally, control systems of this type are used in a manufacturing environment. Such an environment is generally electrically noisy. The term "electrically noisy" means that such environments contain or are subjected to stray unpredictable electromagnetic fields, etc., which generate undesirable electrical currents and voltages in control circuits.

The general approach to actuating treating devices in an automatic system as described above has previously been done as described in the Straw U.S. Pat. No. 3,521,598. Prior art devices, such as that, control the actuation of treating devices by means of a sensor or mechanical linkage responsive to a cam on the drive mechanism of the indexing conveyor. The cam or mechanical linkage in a predetermined position would indicate that the conveyor was in the proper position for articles to be treated. The articles were treated whenever the cam or mechanical linkage indicated that the conveyor was in a proper position. If there was a possibility that an article could be missing from a given treating position, a second sensor responsive to the presence or absence of the article was required in order to inhibit actuation of the treating device.

SUMMARY OF THE INVENTION

In one embodiment the subject of this invention is an improved control system for the treating devices used in can coating systems utilizing indexing type conveyors.

The system includes a sensor which has operating characteristics and is positioned with respect to the conveyor such that it is in one state when no article is in a given treating position or station, and takes on a second state when an article is in a given treating station regardless of whether the conveyor is moving or stopped. The control circuitry actuates the treating device whenever the sensor indicates the presence of an article for some predetermined minimum time period. Such a signal would indicate to the automatic system that an article is present in a treating position, and is stopped, and therefore treating should proceed. However, transient type indications will not be of sufficient duration to actuate the treating device. For example in a system which spray coats two cans simultaneously, the conveyor would move the distance of two pockets on each move. Therefore each can will pass through both spraying positions, but will only stop at one of the positions. While the conveyor is moving, the article passing through a coating position will not trigger the spray gun.

When used in conjunction with an indexing type conveying system the present invention eliminates the need for mechanical, electrical or other type of tie-in to the drive mechanism of the conveyor, and can therefore be added to an existing indexing type of conveyor very easily and inexpensively. Further, only one sensor for each treating device is required to provide both automatic actuation of the treating device, and no-article/no-treatment control during any treating period, and yet without any mechanical or other tie-in to the conveyor drive mechanism.

It is a further object of this invention to provide an apparatus for automatically controlling treating devices in an electrically noisy environment.

DESCRIPTION OF THE PREFERRED EMBODIMENT

Figure 1:
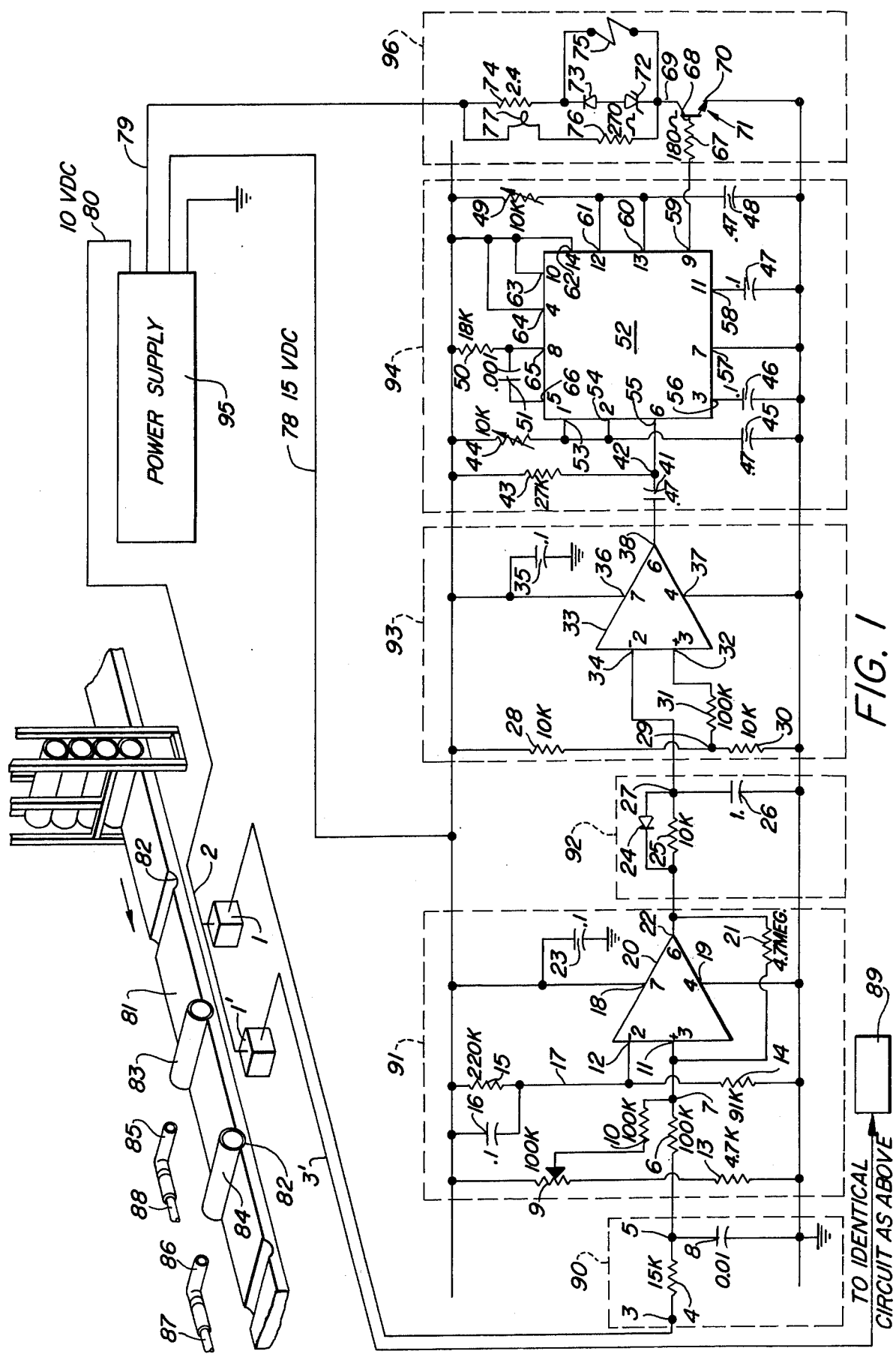
FIG. 1 is a schematic drawing of an electrical circuit used in conjunction with an indexing type conveyor (functionally depicted) wherein two articles can be spray coated simultaneously.

In FIG. 1, articles to be coated 83 and 84 are conveyed by conveyor 81 in equally spaced pockets generally designated as 82 to predetermined stopped positions proximate spray guns 85 and 86 respectively. In this particular system, the conveyor 81 moves a distance of two pockets each time it indexes. Therefore, it will be noted that article 84 passes gun 85 on the way to gun 86, and article 83 passes gun 86 on its way from gun 85. The conveyor moves the articles into position, stops for a predetermined period of time, and then moves the articles out of the treating zones.

Proximate each spray station is a sensor, 1 and 1'. In this embodiment the sensors 1 and 1' are electromagnetic proximity type sensors which provide an output at nodes 3 and 3'. Sensors 1 and 1' are positioned with respect to the conveyor 81 to sense the presence or absence of articles in spraying positions for spray guns 85 and 86 respectively. The outputs 3 and 3' take on one state when an article is in the corresponding spray station, and take on another state when no article is in that spray station. These sensors can be of a variety of commercially available units such as a model 3041 manufactured by Peco Corporation. Further, they could be of a different type such as a microswitch, or any other device which would provide the same ultimate function.

The circuit 89 controlling spray gun 86 and the circuit controlling spray gun 85 would be identical. Therefore, only one of the circuits is depicted and described below. Electrical power for the circuit is provided by power supply 95 which can be of any commercially available type which will supply proper voltages and current to the control circuits, proximity sensors if necessary, and output circuits of a control device. In this embodiment power line 78 provides 15 VDC for the control circuits, power line 80 provides 10 VDC to the sensors 1 and 1', and power line 79 provides the voltage required for the output circuitry 96.

Sensor 1 receives power from power supply 95 through an input terminal 2. Its output 3 is connected to a low pass filter 90 which consists of resistor (hereafter "R") 4 and capacitor (hereafter "C") 8. Filter 90 as used in this embodiment, removes high frequency noise from the output signal of sensor 1. The output 5 of the filter 90 is connected to the input of an adjustable level detector generally designated as the circuitry surrounded by dotted line 91.

In the level detector 91, one terminal of a potentiometer 9 is connected to the 15 volt power source 78 and the other terminal of potentiometer 9 is connected through R13 to ground. The combination of potentiometer 9 and R13 in conjunction with the adjustable center tap on potentiometer 9 provides an adjustable reference voltage. The outputs of filter 90 and the reference voltage from the center tap of potentiometer 9 are summed through summing resistors 6 and 10 respectively at the non-inverting input 11 of an operational amplifier 20. The operating characteristics of operational amplifiers generally are well known in the art and will not be discussed in detail here. Such units are commercially available, for example model 741 manufactured by Raytheon Corporation will operate satisfactorily. The reference voltage from potentiometer 9 makes the output of filter 90, which is a function of the output of the sensor 1, compatible with the supply voltage and input characteristics of operational amplifier 20. Provision for adjustment by means of potentiometer 9 is included to allow the control circuit to be used with various sensors which may have different output characteristics.

R15 and R14 are connected in series between the 15 volt supply 78 and ground. The junction 17 between R15 and R14 is connected to the inverting input 12 of operational amplifier 20. This connection establishes a reference voltage at the inverting input 12 against which the signal at noninverting input 11 is compared. R21 connected between output 22 and input 11 establishes a small amount of hysteresis in the operating characteristics of operational amplifier 20. When the voltage at input 11 is less than a voltage established by the voltage at junction 17, output 22 will be at some voltage level near 0 (hereafter "low state"). If the voltage at input 11 is greater than a voltage established by the voltage at junction 17, output 22 will be at some voltage level near 15 volts (hereafter "high state"). The hysteresis provided by R21 causes output 22 to change from its high to low state in response to the voltage at input 11 at a slightly different value than as required for the output 22 to change from its low to high state. This hysteresis eliminates "chatter" when the voltage at input 11 is exactly at or very close to the voltage required to change output 22 from high to low or vice versa.

Output 22 of operational amplifier 20 is connected to the input of an integrating circuit with a rapid reset, generally designated by the circuit outlined by dotted line 92. This circuit consists of R25 having one terminal connected to output 22 and its second terminal connected to one terminal of C26 wherein the second terminal of C26 is connected to ground. A Diode 24 connected across R26 rapidly discharges C26 whenever output 22 is in its low state.

The common junction 27 of R25, C26, and diode 24 is connected to the inverting input 34 of an operational amplifier 33. R28 and R30, connected in series between the 15 volt supply 78 and ground, establish a reference voltage at their common junction 29 which is connected to the noninverting input 32 of operational amplifier 33 through an isolation resistor 31. This reference voltage at junction 29 establishes a voltage required at inverting input 34 to cause the output 38 of operational amplifier 33 to be in a high or low state. If the voltage at input 34 is less than this required voltage, output 38 will be in or change to its high state. If the voltage at input 34 is greater than the required voltage, output 38 will be in or change to its low state.

Junctions 18, 19 and 36, 37 are power supply terminals for operational amplifiers 20 and 33 respectively. C23 and C35 are de-coupling capacitors connected physically close to supply voltage terminals 18 and 36 respectively. C16 delays operability of the circuit until all supply voltages have reached their nominal value, so that no signals are generated when the circuit is initially turned on. Such a technique is fully described in U.S. Pat. No. 3,862,414 issued to Algeri, one of the co-inventors of this present invention.

The circuit generally designated as 52 is a "dual one shot." Such devices are commercially available and well known in the art. An example of such a device is a model 556 integrated circuit manufactured by Raytheon Corporation. When using such a device in conjunction with the circuit described above, the output 38 of operational amplifier 33 is connected to input 55 of a first one shot of circuit 52 through C41. When output 38 changes from its high state to its low state, an output 66 will change from a high state to a low state and remain in such low state for a period of time determined by the combination of R44 connected between the 15 volt supply and terminals 53 and 54 of circuit 52 in conjunction with C45 connected between terminals 53 and 54 of circuit 52 and ground. Output 66 is connected through capacitor 51 to the input terminal 65 of the second one shot in integrated circuit 52. When output 66 changes from a high state to a low state, this change coupled into input 65 causes the output 59 of the second one shot to change from a low state to a high state for a time period determined by the combination of R49 connected between the 15 volt supply and control terminals 61 and 60 on integrated circuit 52, in conjunction with C48 connected between the same input terminals 61, 60 and ground.

For the sake of clarity the specific input terminal numbering corresponding to the Raytheon model 556 dual one shot integrated circuit are provided within the block representing this integrated circuit.

R43 and R50 connected between the 15 volt supply 78 and input terminals 55 and 65 respectively are bias resistors for these input terminals. 15 volt supply 78 is also connected to pins 64, 63 and 62 on integrated circuit 52. Terminal 57 on integrated circuit 52 is connected to ground. Terminals 56 and 58 are connected to ground through C46 and C47 respectively.

The dual one shot integrated circuit 52 provides delay and duration control of the spray gun 85. Output 66 would control the delay time which is the time for which spray gun 85 would be delayed after the circuit had determined that an article was stopped in a spraying station. This delay time can allow time for other controlled functions to take place (e.g. moving the spray gun nozzle inside of a can). The second one shot output 59 determines how long spray gun 85 will operate on each cycle after this second one shot is triggered.

The output 59 of integrated circuit 52 is connected to the input terminal of an output device 96. A typical output circuit is depicted for convenience but the details of such an output circuit in no way forms part of the basis of this invention and the details are omitted here. The output circuit 96 is operative to activate solenoid 75. Solenoid 75 in turn would operate an electrical, pneumatic, mechanical etc. device which would in turn activate spray gun 85.

Spray gun 85 can be of any of the conventional well known types including electrostatic. Material supply, electrical supply if applicable, and control lines are generally designated as 88 in the drawing.

Figure 2:
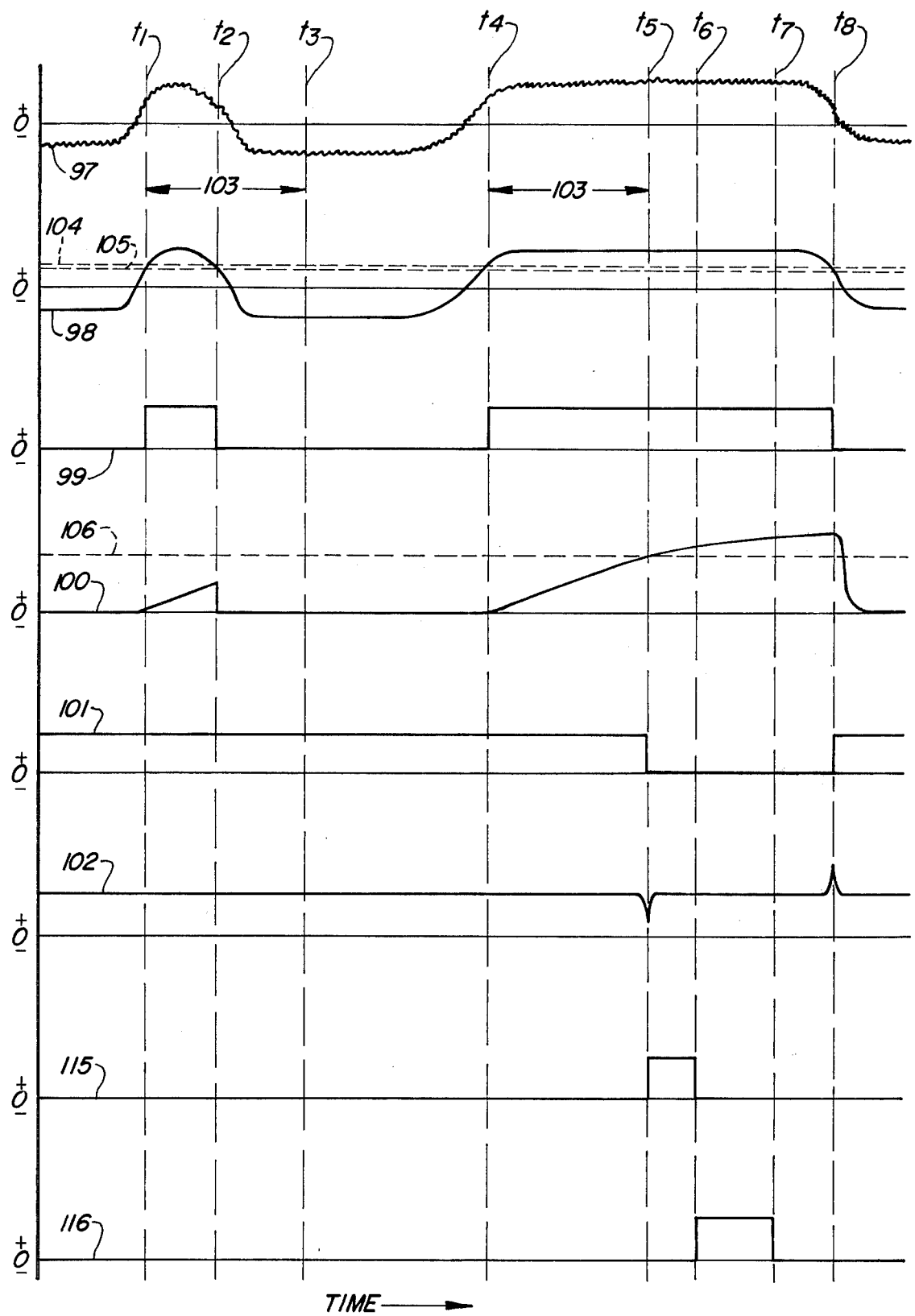
FIG. 2 is a graphic representation of the voltages at various points in the circuit of FIG. 1 as a function of time, which are typical of those encountered in operation of the overall system.

The operation of the circuit can be understood by referring to the graphs of FIG. 2 in conjunction with the circuit diagram of FIG. 1. The graphs of FIG. 2 represent typical voltage wave forms as a function of time at various nodes of the circuit. The event represented by the voltage wave forms depicted between times t1 and t2 could represent article 84 passing sensor 1 on its way to the spray station for spray gun 86, or could represent article 83 passing sensor 1 after being sprayed by spray gun 85. The event represented by the voltage wave forms depicted between times t4 to t8 could represent article 83 arriving at the spray station for spray gun 85, remaining for the conveyor dwell time and then being moved out, or a similar process at the spray station for spray gun 86. Wave form 97 represents a typical output voltage of sensor 1. At times noted t1 and t4 the sensor 1 begins to detect the presence of an object in its corresponding spray station. At times designated as t2 and t8 sensor 1 ceases to detect the presence of an article. Wave form 98 shows corresponding voltage at node 5. With proper adjustment of R9, wave form 99 represents the voltage at output 22 corresponding to sensor voltage 97. Wave form 100 depicts the circuit response at node 27 in response to sensor signal 97. The dotted line 106 represents the voltage which must be exceeded at node 27 in order for output 38 of operational amplifier 33 to change state. It is noted that the article detected between time t1 and t2 has not been sensed for a period of time 103 long enough for the voltage at node 27 to reach voltage level 106. Therefore, at time t2 when the article ceases to be detected, the voltage at node 27 has been reset by discharge of C26 through diode 24, and the output of level detector 93 has gone unchanged, as has the output of the delay and duration timers. Hence the circuit is not activated by articles merely moving past the sensors.

At a later time t4 an article is again sensed for a period of time extending to time t8. During this time the voltage at node 27 has increased beyond the level indicated by dotted line 106 and hence the output of level detector 93 has changed state; the voltage at node 42 takes on the wave shape of a negative spike, as indicated in FIG. 2 by wave form 102; the output of the delay timer part of integrated circuit 52 produces the wave form indicated by line 115, and the output of the duration timer part of integrated circuit 52 produces the wave form depicted by line 116. Again, the output of the duration timer portion of integrated circuit 52 actuates solenoid 75 which in turn causes spray gun 85 to operate.

It will be noted that the circuits for sensors 1 and 1' operate independently. Therefore if there is no article at either spray station during the conveyor dwell time, then the spray gun for that station does not operate. However if there is a can stationary for a time period greater than or equal to that between times t4 and t5 or t1 and t3 then the spray gun associated with that sensor will be operated regardless of the other station.

While a very specific embodiment of this invention has been described, it should be noted that several modifications can be made to the circuit described which would in no way change the basic nature of the invention. For example, a method of practicing this invention could utilize mechanical, pneumatic or fluidic type circuits. Further, various of the functions included in the specific embodiment described above may be omitted in various applications.

Filter 90 could be omitted if the output signal from sensor 1, and the environment in which the system were installed were free from noise.

Further, level detector and bias circuit 91 could be eliminated if the environment of the system were such that electrical noise was not a problem, and the sensor could provide the proper voltage level changes and enough current to drive the inhibitor circuit consisting of blocks 92 and 93. Level detector 93 could be made of discrete components rather than an operational amplifier.

The inhibitor circuit consisting of 92 and 93 could be accomplished with digital components as opposed to these analogue components.

Delay and duration timers as depicted in block 94 are optional. They are only required when actuation of the spray gun is to be delayed for a certain time period after the presence of a stationary object in the spray station has been detected (for example where some other manipulative procedure must be carried out prior to spraying such as inserting the spray gun inside of the can prior to actuation of the gun). The duration timer portion of block 94 is only required where spraying is required for a specific predetermined time interval.

It should be noted that the level detector and bias circuitry depicted in block 91 could possibly be considered part of the inhibitor circuit combination of 92 and 93 since it provides signal conditioning for noisy signals such as depicted in wave form 97 and biases the output of the sensor 1 so that the output is compatible with the time dependent inhibitor circuit 92, 93. However if the output of the sensor is free of noise, and operates at a voltage compatible with the inhibitor circuit 92, 93, then circuit 91 is not needed. Therefore, all that is required is that the input of the time dependent inhibitor be functionally connected to the output 3 of the sensor 1 and the output of the time dependent inhibitor be connected functionally to cause operation of the spray gun. By "functionally connected" it is meant that the output of a device ultimately controls actuation of the device it is functionally connected to. In other words, the two devices may be connected through another device for signal conditioning or the like. As an example, in the embodiment described the output of the sensor is functionally connected to the input of the time dependent inhibitor even though it is not physically connected directly to it.

Having described my invention I claim:

1. A system for automatically treating articles comprising:
    a conveyor which conveys the articles to be treated into and out of a predetermined treating position, and which translationally stops said articles in said treating position for a predetermined period of dwell time sufficient to treat said articles;
    a sensor positioned to sense articles in said treating position having an output which is in a first state when no article is sensed, and in a second state when an article is sensed;
    a time dependent inhibitor having a control input functionally connected to the output of the sensor and an output which remains in a first state until said sensor output has remained in its second state for a predetermined time period, and which inhibitor output changes to a second state after said period has elapsed;
    means to rapidly reset the timing period when said sensor output has changed to its first state from its second state;
    an article treatment apparatus having a control input functionally connected to said inhibitor output, and which apparatus is activated in response to said second state of said inhibitor output.

2. The system of claim 1 which further comprises: a duration timer having a control input and an output, said duration timer controlling the time said article treatment apparatus is activated, and functionally connecting said inhibitor output and said treating apparatus control input by means of said duration timer's control input and output respectively.

3. The system of claim 2 wherein the inhibitor comprises a low pass filter having an input and output with its input acting as the inhibitor input, and a level detector having an input and output wherein its input is connected to the output of said low pass filter and its output is functionally connected to the control input of said duration timer.

4. The system of claim 3 wherein the low pass filter is a resistor-capacitor network and the reset means is a diode connected to discharge said capacitor through said inhibitor input.

5. The system of claim 3 wherein the treating device is a spray coating gun.

6. A system for automatically treating articles comprising:
    a conveyor which conveys two or more articles simultaneously and along the same path to a corresponding number of treating positions, and which translationally stops said articles in said treating positions for a predetermined period of dwell time sufficient to treat said articles;
    a separate trigger apparatus associated with each treating position, wherein at least one comprises:
    a sensor positioned to sense articles in said treating position having an output which is in a first state when no article is sensed and in a second state when an article is sensed;
    a time dependent inhibitor having a control input functionally connected to the output of the sensor and an output which remains in a first state until said sensor output has remained in its second state for a predetermined time period and which inhibitor output changes to a second state after said period has elapsed;
    means to rapidly reset the timing period when said sensor output has changed to its first state from its second state;
    an article treatment apparatus having a control input functionally connected to said inhibitor output and which apparatus is activated in response to said second state of said inhibitor output.

7. The system of claim 6 in which the trigger apparatus further comprises a duration timer having a control input and an output, said duration timer controlling the time said article treatment apparatus is activated, and functionally connecting said inhibitor output and said treating apparatus control input by means of said duration timer's control input and output respectively.

8. The system of claim 7 wherein the inhibitor comprises a low pass filter having an input and output with its input acting as the inhibitor input, and a level detector having an input and output wherein its input is connected to the output of said low pass filter and its output is functionally connected to the control input of said duration timer.

9. The system of claim 8 wherein the low pass filter is a resistor-capacitor network and the reset means is a diode connected to discharge said capacitor through said inhibitor input.

* * * * *